United States Patent
Zhou et al.

(10) Patent No.: US 8,987,141 B2
(45) Date of Patent: Mar. 24, 2015

(54) METHOD OF MANUFACTURING SI-BASED HIGH-MOBILITY GROUP III-V/GE CHANNEL CMOS

(71) Applicant: Institute of Semiconductors, Chinese Academy of Sciences, Beijing (CN)

(72) Inventors: Xuliang Zhou, Beijing (CN); Hongyan Yu, Beijing (CN); Shiyan Li, Beijing (CN); Jiaoqing Pan, Beijing (CN); Wei Wang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/222,392

(22) Filed: Mar. 21, 2014

(65) Prior Publication Data

US 2015/0024601 A1    Jan. 22, 2015

(30) Foreign Application Priority Data

Jul. 22, 2013  (CN) .......................... 2013 1 0306968

(51) Int. Cl.
*H01L 21/311* (2006.01)
*H01L 21/3065* (2006.01)

(52) U.S. Cl.
CPC .................................. *H01L 21/3065* (2013.01)
USPC ........... 438/700; 438/503; 438/504; 438/507; 438/509; 438/492; 438/199; 438/275; 438/153; 438/154; 438/719; 257/347; 257/349; 257/350; 257/E21.091; 257/E21.092; 257/E21.102; 257/E21.108; 257/E21.115; 257/E21.12; 257/E21.133; 257/E21.618; 257/E21.633; 257/E21.221; 257/E21.223

(58) Field of Classification Search
USPC ......... 438/199, 275, 153, 154, 503, 504, 507, 438/509, 492, 700, 719; 257/347, 349, 350, 257/E21.091, E21.092, E21.102, E21.108, 257/E21.115, E21.12, E21.133, E21.618, 257/E21.633, E21.221, E21.223
See application file for complete search history.

(56) References Cited

U.S. PATENT DOCUMENTS

| 4,952,527 A | * | 8/1990 | Calawa et al. ................ 438/167 |
| 5,084,409 A | * | 1/1992 | Beam et al. .................... 438/429 |

(Continued)

FOREIGN PATENT DOCUMENTS

| CN | 102664166 A | 9/2012 |
| CN | 102790054 A | 11/2012 |
| CN | 103107096 A | 5/2013 |

OTHER PUBLICATIONS

J. S. Park et al., "Defect reduction of selective Ge epitaxy in trenches on Si(001) substrates using aspect ratio trapping", Appl. Phys. Lett. 90, 052113, 2007, 3 pages.

(Continued)

*Primary Examiner* — Kimberly Rizkallah
*Assistant Examiner* — Robert Bates
(74) *Attorney, Agent, or Firm* — Fish & Richardson P.C.

(57) ABSTRACT

A method can include: growing a Ge layer on a Si substrate; growing a low-temperature nucleation GaAs layer, a high-temperature GaAs layer, a semi-insulating InGaP layer and a GaAs cap layer sequentially on the Ge layer after a first annealing, forming a sample; polishing the sample's GaAs cap layer, and growing an nMOSFET structure after a second annealing on the sample; performing selective ICP etching on a surface of the nMOSFET structure to form a groove, and growing a $SiO_2$ layer in the groove and the surface of the nMOSFET structure using PECVD; performing the ICP etching again to etch the $SiO_2$ layer till the Ge layer, forming a trench; cleaning the sample and growing a Ge nucleation layer and a Ge top layer in the trench by UHVCVD; polishing the Ge top layer and removing a part of the $SiO_2$ layer on the nMOSFET structure; performing a CMOS process.

12 Claims, 5 Drawing Sheets

(56) References Cited

U.S. PATENT DOCUMENTS

| | | | |
|---|---|---|---|
| 5,411,914 A * | 5/1995 | Chen et al. | 438/167 |
| 5,439,843 A * | 8/1995 | Sakaguchi et al. | 438/459 |
| 6,372,981 B1 * | 4/2002 | Ueda et al. | 136/261 |
| 6,858,522 B1 * | 2/2005 | Burton et al. | 438/571 |
| 8,274,097 B2 | 9/2012 | Cheng | |
| 8,395,187 B2 * | 3/2013 | Nakano et al. | 257/194 |
| 2004/0012037 A1 * | 1/2004 | Venkatesan et al. | 257/200 |
| 2009/0035534 A1 * | 2/2009 | Su et al. | 428/195.1 |
| 2011/0156005 A1 | 6/2011 | Pillarisetty et al. | |
| 2013/0048061 A1 * | 2/2013 | Cheng et al. | 136/255 |
| 2013/0119347 A1 * | 5/2013 | Cho et al. | 257/24 |
| 2013/0264609 A1 | 10/2013 | Di et al. | |
| 2014/0183561 A1 * | 7/2014 | Shimizu | 257/77 |

OTHER PUBLICATIONS

M. Yokoyama et al., "III-V/Ge High Mobility Channel Integration of InGaAs n-Channel and Ge p-Channel Metal-Oxide-Semiconductor Field-Effect Transistors with Self-Aligned Ni-Based Metal Source/Drain Using Direct Wafer Bonding", Appl. Phys. Express 5, 076501, 2012, 3 pages.

Office Action issued Nov. 4, 2014, in Counterpart Chinese Application No. 201310306968.2, 11 pages.

* cited by examiner

METHOD OF MANUFACTURING SI-BASED HIGH-MOBILITY GROUP III-V/GE CHANNEL CMOS

CROSS-REFERENCE TO RELATED APPLICATIONS

This application claims the benefit under 35 U.S.C. §119 of Chinese Patent Application No. 201310306968.2, filed Jul. 22, 2013, which is incorporated herein by reference in its entirety.

TECHNICAL FIELD

The present invention relates to the microelectronics field. The present invention may implement integration of Si-based high-mobility Group III-V/Ge channel materials by combining Ultrahigh Vacuum Chemical Vapor Deposition (UHVCVD) and Metal-Organic Chemical Vapor Deposition (MOCVD) and using high Aspect Ratio Trapping (ART) technique. The present invention may be applied to a Si-based Group III-V/Ge channel CMOS device.

BACKGROUND

As the feature size of devices is reduced to 22 nm node, difficulties may occur in improving operating speed of chips therein, increasing integration and decreasing costs by reducing the feature size using integrated circuit technique according to Moore's Law. With the increase of costs for nanometer process, the short channel effect degrades the control ability of gates, and factors, such as limitation of mobility of Si material itself etc., make it impossible to reduce the feature size of the device continuously. Therefore, various possible solutions are proposed constantly. A third generation Ivy Bridge processor launched in China by Intel in April 2012 utilizes a 22 nm manufacture process of a 3D tri-gate FinFET. Another solution is to employ Group III-V/Ge high-mobility channels.

The electron mobility of a Group III-V compound semiconductor is much higher than that of Si (e.g. the electron mobility of GaAs and InAs materials may be up to 9000 $cm^2V^{-1} \cdot s^{-1}$ and 40000 $cm^2V^{-1} \cdot s^{-1}$, respectively, while the electron mobility of Si is only 1300 $cm^2V^{-1} \cdot s^{-1}$). The Group III-V compound semiconductor may have excellent electron transport performance in either a low field or a high field, and may be an ideal channel material for nMOS of ultrahigh speed and low power consumption. At the same time, the hole mobility of Ge (1800 $cm^2V^{-1} \cdot s^{-1}$) is higher than that of Si (500 $cm^2V^{-1} \cdot s^{-1}$). It has become a focus of research in the microelectronics field to substitute the strained-Si material for channel with the high-mobility Group III-V semiconductor material and Ge material compatible with Si processes so as to significantly improve the switch speed of logic circuits and to achieve low power consumption.

A precondition for manufacturing a Si-based high-mobility CMOS device with a large area and low costs is epitaxial growth of high-quality Group III-V semi-conductor material and Ge material on a Si substrate. Epitaxial growth of Si-based Ge material and devices thereon are always important research topics in micro-electronics and photo-electronics field. UHVCVD may be used for obtaining a Ge layer with a high quality and flat surface. On the other hand, GaAs is a relative mature Group III-V semiconductor material, but epitaxial growth of Si-based GaAs may encounter many problems. There are a substantial lattice mismatch (4.1%) and a substantial thermal mismatch (thermal expansion coefficients of Si and GaAs are $2.59 \times 10^{-6} K^{-1}$ and $5.75 \times 10^{-6} K^{-1}$, respectively) between Si and GaAs. Therefore, a great amount of dislocations will occur during heteroepitaxial growth. Also, a great deal of APDs (Anti-phase domains) may be generated in an epitaxial layer during epitaxial growth of a polar material on a non-polar substrate. The APDs may also be generated due to existence of substrate steps. An APB (Anti-phase boundary) is a scattering and recombination center of carriers, which may introduce a defect level in a forbidden band. These dislocations and APBs may extend to a surface of the epitaxial layer, which will substantially affect quality of the epitaxial layer. Typically, a Ge layer is grown as a transition layer before growth of the Si-based Group III-V semi-conductor material. Then a high-quality Group III-V layer may be formed by controlling growth of the GaAs layer using MOCVD.

However, it is yet impossible to integrate the Ge material and the Group III-V compound semi-conductor material on a same Si substrate while implementing CMOS functions. Currently, a solution approaching this object is a prototype Ge-based CMOS device which integrates an nMOSFET and a pMOSFET by bonding an InGaAs channel to a Ge substrate (M. Yokoyama et al, Appl. Phys. Express 5, 076501, 2012). Another solution for integrating a Group III-V n-type channel and a Ge p-type channel is to utilize Si-based selective epitaxial growth. However, the quality of the Group III-V or Ge material obtained by the selective epitaxial growth, size of which is in the order of micrometers, is not ideal. Thus, the viability of the solution is yet to be determined. Also, tiny-size selective epitaxial growth employing high ART is getting a lot of attentions recently (J. S. Park et al, Appl. Phys. Lett. 90, 052113, 2007). An epitaxial material in a $SiO_2$ trench is grown along a crystal plane consisting of {311} and {111} crystal planes (in parallel with the direction of the trench). Defects, such as mismatch dislocations, etc., at a Si—Ge interface generally extend along a growth direction of the epitaxial layer. As such, the mismatch dislocations are blocked by a $SiO_2$ wall and thus cannot extend to a top layer. However, integration of the Si-based high-mobility N and P channels cannot be implemented by such a solution.

The method of the present invention utilizes UHVCVD in forming transition from the Si substrate to the Ge layer, and eliminates 4% strain by relaxed Ge at a bottom layer. Since the lattice mismatch between GaAs and Ge is only 800 ppm, generation of the mismatch dislocations between the Ge layer and the GaAs layer can be reduced. The problems related to the APDs and defects may be solved by combination of high- and low-temperature GaAs layers. Additionally, selective etching and ART epitaxial growth of Ge material are used in order to integrate the high-mobility Group III-V semiconductor and the Ge region on the Si substrate. Then a source-drain-gate process may be used to finally implement integration of the high-mobility InGaAs n-type channel and the Ge p-type channel on the Si substrate.

SUMMARY

An object of the present invention is to provide a method of manufacturing a Si-based high-mobility Group III-V/Ge channel CMOS, so as to obtain a high-speed Si-based CMOS having a high electron mobility characteristic of the Group III-V semiconductor and a high hole mobility characteristic of Ge.

The present invention provides a method of manufacturing a Si-based high-mobility Group III-V/Ge channel CMOS, comprising:

Step 1: growing a Ge layer on a cleaned Si substrate using UHVCVD;

Step 2: immediately placing the Si substrate in an MOCVD reaction chamber after the Ge layer is formed; and growing a low-temperature nucleation GaAs layer, a high-temperature GaAs layer, a semi-insulating InGaP layer and a GaAs cap layer sequentially on the Ge layer after a first annealing, so as to form a sample;

Step 3: taking the sample out; polishing the GaAs cap layer; cleaning the MOCVD reaction chamber and the sample susceptor; placing the cleaned sample in the MOCVD reaction chamber; and growing an nMOSFET structure after a second annealing;

Step 4: performing selective ICP (Inductively Coupled Plasma) etching on a surface of the nMOSFET structure, etching from the nMOSFET structure downwards till the Ge layer to form a groove; and growing a $SiO_2$ layer in the groove and the surface of the nMOSFET structure using PECVD (Plasma Enhanced Chemical Vapor Deposition);

Step 5: performing the ICP etching again, at a position where the selective etching has been performed, to etch the $SiO_2$ layer till the Ge layer so as to form a trench;

Step 6: cleaning the sample; and growing a Ge nucleation layer and a Ge top layer in the trench using the UHVCVD;

Step 7: polishing the Ge top layer; and removing a part of the $SiO_2$ layer on the nMOSFET structure; and Step 8: performing a CMOS process on the nMOSFET structure and the Ge top layer to form source, drain, and gate structures.

Beneficial effects of the present invention may be achieved as follows:

1. The Ge layer may be used as a transition layer from the Si layer to a Group III-V layer, and then a high lattice quality may be achieved by the low-temperature GaAs layer;

2. A flat Group III-V surface may be obtained by polishing the ultra-thin Group III-V layer;

3. Integration of high-quality Ge material and Group III-V material on the Si substrate may be implemented using an ART method.

BRIEF DESCRIPTION OF THE DRAWINGS

Next, the present invention will be further described in connection with specific embodiment with reference to accompanying drawings, in which.

DETAILED DESCRIPTION

Figure 1:
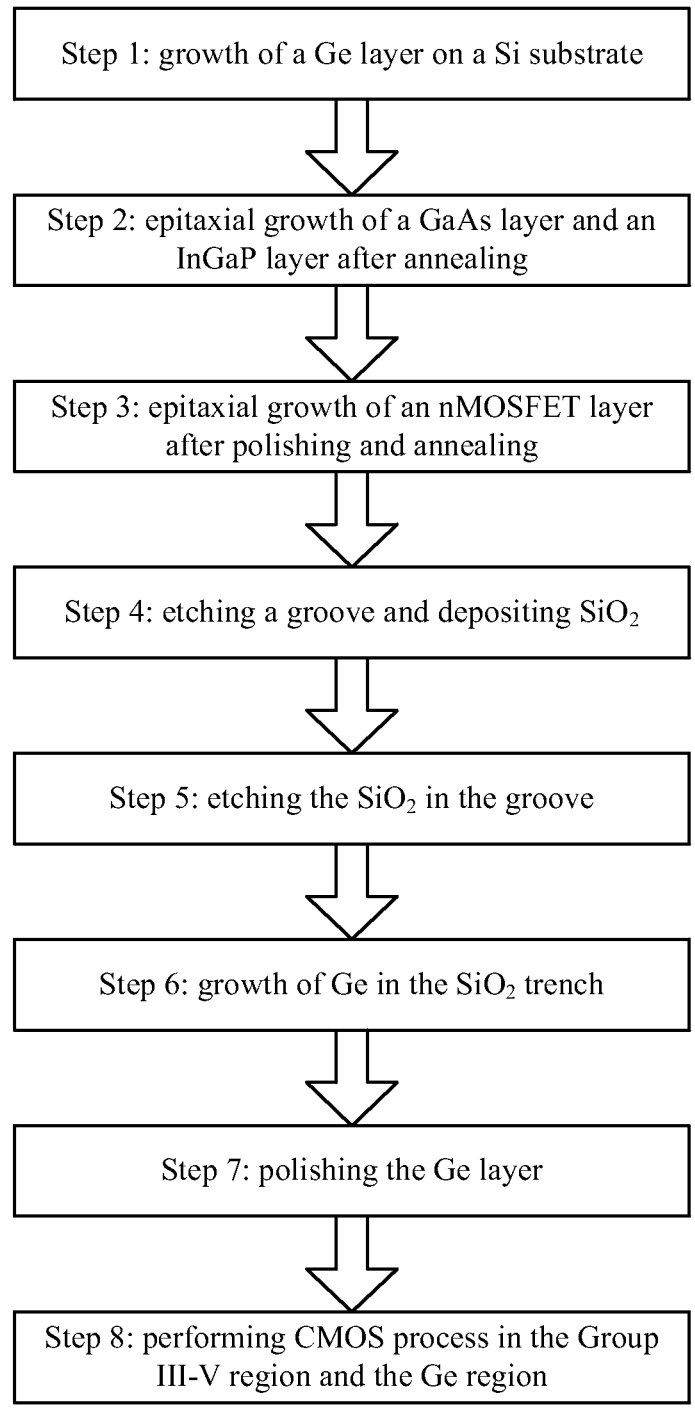
FIG. 1 illustratively shows an flowchart of a manufacture method according to the present invention.
Figure 2:
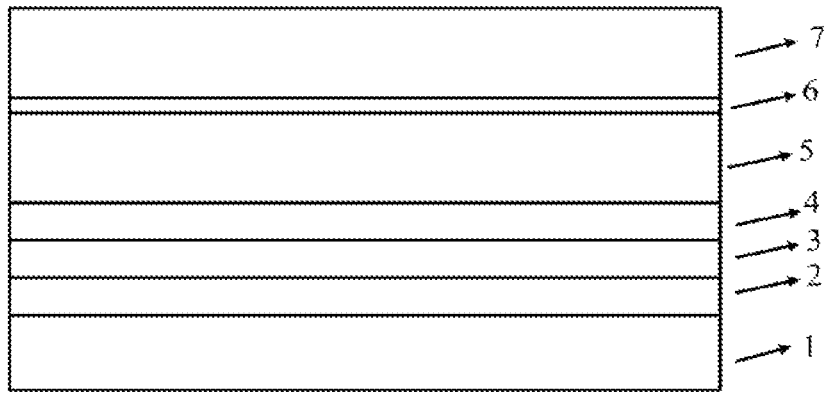
FIGS. 2-9 illustratively show structure diagrams of respective steps according to the present invention.
Figure 3:
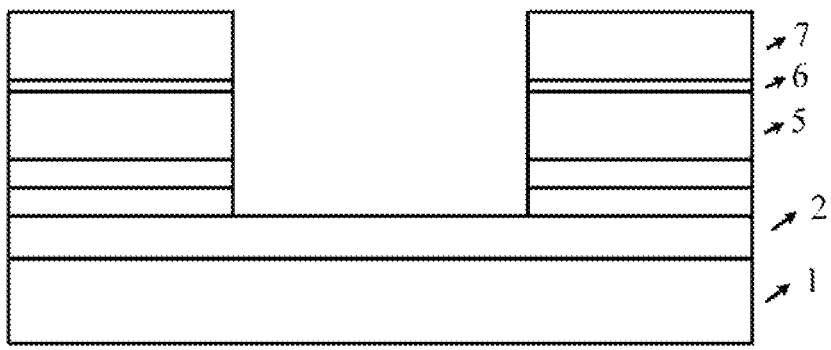

With reference to FIG. 1 in connection with FIGS. 2-9, the present invention provides a method of manufacturing a Si-based high-mobility Group III-V/Ge channel CMOS. The method comprises:

Step 1: growing a Ge layer 2 (referring to FIG. 2) on a cleaned Si substrate 1 using UHVCVD. The Si substrate 1 is a (100) substrate having a 4° miscut angle towards a direction. The miscut angle of the substrate may generally be 3° to 6°, in order to guarantee that atomic steps may be formed on a final Ge layer surface for suppressing APDs during GaAs nucleation. A transition of lattice constant to GaAs may be implemented by the Ge layer. A defect density of the Ge layer is required to be lower than $1 \times 10^6$ $cm^{-2}$, and a surface roughness RMS of the Ge layer may be less than 0.5 nm.

Step 2: immediately placing the Si substrate 1 in an MOCVD reaction chamber after the Ge layer is formed; and growing a low-temperature nucleation GaAs layer 3, a high-temperature GaAs layer 4, a semi-insulating InGaP layer 5 and a GaAs cap layer 6 sequentially on the Ge layer (referring to FIG. 2) after a first annealing, so as to form a sample. The first annealing is performed at a temperature higher than 700° C. for a time period of 20-30 minutes A temperature for a later second annealing and a temperature for growing the high-temperature GaAs layer 4, the semi-insulating InGaP layer 5, the GaAs cap layer 6 and the nMOSFET structure 7 are identical, both of which are in a range of 620-660° C. The second annealing is performed in $AsH_3$ protection atmosphere. The semi-insulating InGaP layer 5 is lattice-matched with the Ge layer 2 and has a growing rate of 0.1 nm/s-0.25 nm/s, with a V/III ratio (a ratio between an input mole flow rate of a Group V source and that of a Group III source) between 75 and 125. Dopant for growing the semi-insulating InGaP layer 5 is ferrocene. A ratio between ferrocene flow and a sum flow of Group III source TMIn and TMGa used for the semi-insulating InGaP layer 5 is about 1:1000. The ferrocene flow is in an order of $1 \times 10^{-8}$ mol/min.

Step 3: taking the sample out; polishing the GaAs cap layer 6; cleaning the MOCVD reaction chamber and the sample susceptor; placing the cleaned sample in the MOCVD reaction chamber; and growing an nMOSFET structure 7 (referring to FIG. 2) after the second annealing. The GaAs cap layer 6 may have a thickness of about 70-100 nm and is removed by less than 50 nm during the polishing. The roughness of the GaAs cap layer 6 to be achieved is less than 0.5 nm. The nMOSFET structure 7 may comprise a GaAs buffer layer, an $Al_{0.3}Ga_{0.7}As$ barrier layer, an $In_{0.25}Ga_{0.75}As$ channel layer, an $In_{0.49}Ga_{0.51}P$ etch stop layer and a GaAs doping contact layer, which are grown subsequently. Si delta doping may be performed in the $Al_{0.3}Ga_{0.7}As$ barrier layer. This layer may be optimized as other parameters.

Figure 4:
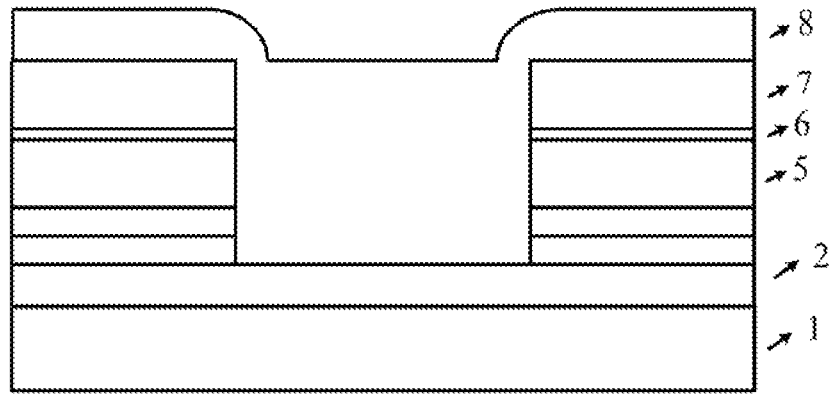

Step 4: performing selective ICP etching on a surface of the nMOSFET structure 7, etching from the nMOSFET structure 7 downwards till the Ge layer 2 to form a groove (referring to FIG. 3); and growing a $SiO_2$ layer 8 in the groove and the surface of the nMOSFET structure 7 using PECVD (referring to FIG. 4). The groove formed by the selective ICP etching has a parallel pattern, with a groove width being 500 nm and a space between neighboring grooves being 500-1000 nm. The Ge layer 2 is etched from a bottom of the groove downwards by a thickness of 50-100 nm. A top of the $SiO_2$ layer 8 in the groove is flushed with a top of the nMOSFET structure 7 (referring to FIG. 4).

Figure 5:
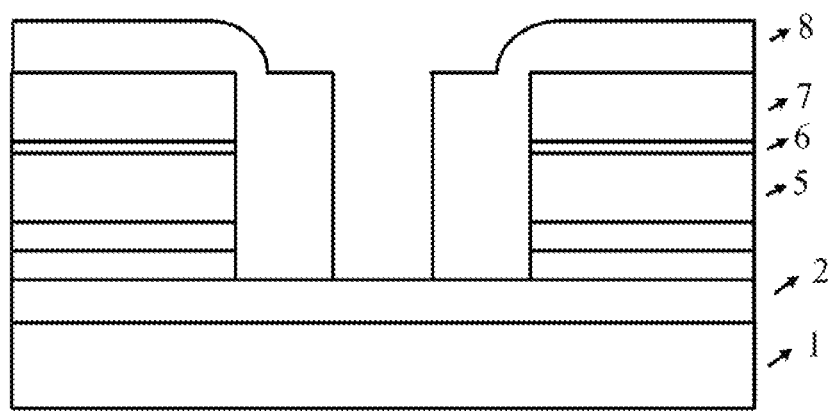
Figure 6:
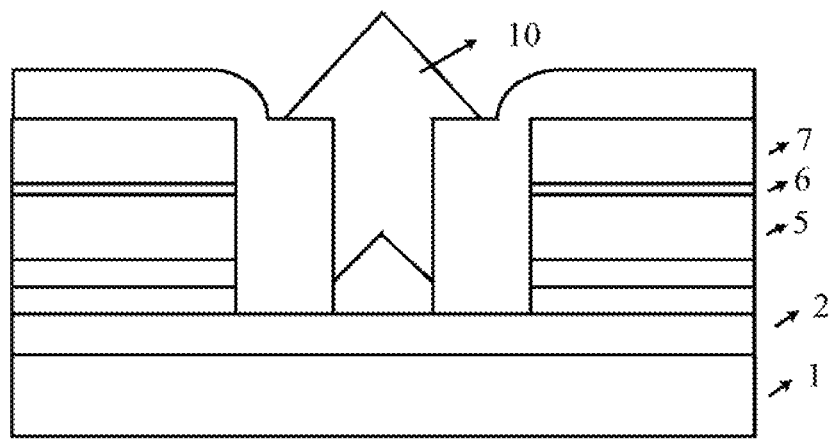

Step 5: performing the ICP etching again, at a position where the selective etching has been performed, to etch the $SiO_2$ layer 8 till the Ge layer 2 so as to form a trench (referring to FIG. 5). A width of the trench is 100-200 nm, and the thicknesses of the $SiO_2$ material on both sides of the trench are identical. A depth of the trench is relative to that of the Group III-V material. However, it should be assure that an aspect ratio of the trench is larger than 2, in order to suppress dislocations of the Ge layer using ART. The $SiO_2$ material on both sides of the trench may be used as an insulating isolation spacer.

Step 6: cleaning the sample; and growing a Ge nucleation layer 9 and a Ge top layer 10 in the trench (referring to FIG. 6) using the UHVCVD. A top surface of the Ge top layer 10 is 100-150 nm higher than a top surface of the $SiO_2$ layer 8 in the groove. The trench is fully filled with Ge.

Figure 7:
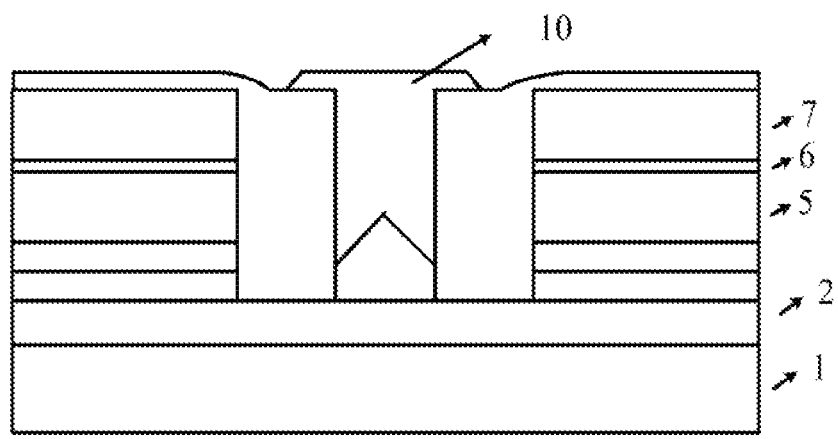
Figure 8:
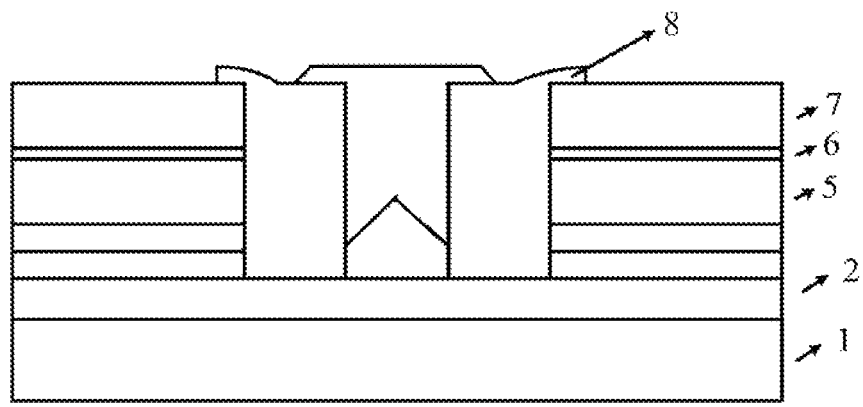
Figure 9:
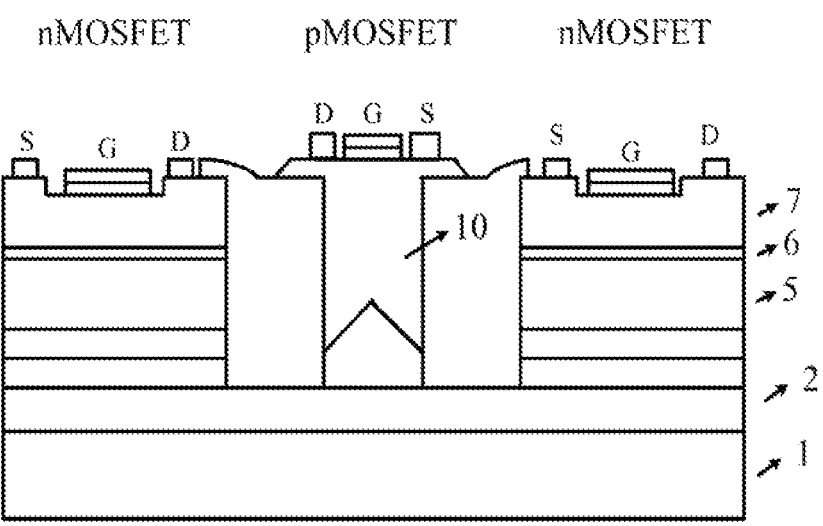

Step 7: polishing the Ge top layer 10; and removing a part of the $SiO_2$ layer 8 on the nMOSFET structure 7 (referring to FIG. 7). The Ge top layer 10 is corroded by HF diluted solution before being polished, so that the thickness of the SiO$_2$ layer 8 on the top of the nMOSFET structure 7 is reduced to 50 nm. Then the Ge top layer 10 is polished to be flushed with the SiO$_2$ layer 8.

Step 8: performing a CMOS process on the nMOSFET structure 7 and the Ge top layer 10 to form source, drain, and gate structures.

The objects, solutions, and advantages of present invention have been described above with reference to the preferred embodiments thereof. It should be understood that various modifications, alternations and additions can be made by those skilled in the art without departing from the spirits and scope of the present invention. Therefore, the scope of the present invention is not limited to the above particular embodiments but only defined by the claims as attached.

We claim:

1. A method of manufacturing a Si-based high-mobility Group III-V/Ge channel CMOS, comprising:

growing a Ge layer on a clean Si substrate using Ultrahigh Vacuum Chemical Vapor Deposition (UHVCVD);

immediately placing the Si substrate in a Metal-Organic Chemical Vapor Deposition (MOCVD) reaction chamber after the Ge layer is formed; and growing a low-temperature nucleation GaAs layer, a high-temperature GaAs layer, a semi-insulating InGaP layer and a GaAs cap layer sequentially on the Ge layer after a first annealing, so as to form a sample;

taking the sample out; polishing the GaAs cap layer; cleaning the MOCVD reaction chamber and the sample susceptor; placing the cleaned sample in the MOCVD reaction chamber; and growing an nMOSFET structure after a second annealing;

performing selective Inductively Coupled Plasma (ICP) etching on a surface of the nMOSFET structure, etching from the nMOSFET structure downwards till the Ge layer to form a groove; and growing a SiO$_2$ layer in the groove and the surface of the nMOSFET structure using Plasma Enhanced Chemical Vapor Deposition (PECVD);

performing the ICP etching again, at a position where the selective etching has been performed, to etch the SiO$_2$ layer till the Ge layer so as to form a trench;

cleaning the sample; and growing a Ge nucleation layer and a Ge top layer in the trench using the UHVCVD;

polishing the Ge top layer; and removing a part of the SiO$_2$ layer on the nMOSFET structure; and performing a CMOS process on the nMOSFET structure and the Ge top layer to form source, drain, and gate structures.

2. The method of manufacturing the Si-based high-mobility Group III-V/Ge channel CMOS according to claim 1, wherein the Si substrate is a (100) substrate having a 4° miscut angle towards a [011] direction.

3. The method of manufacturing the Si-based high-mobility Group III-V/Ge channel CMOS according to claim 1, wherein: the first annealing is performed at a temperature higher than 700° C. for a time period of 20-30 minutes; a temperature for the second annealing and a temperature for growing the high-temperature GaAs layer, the semi-insulating InGaP layer, the GaAs cap layer, and the nMOSFET structure are identical, both of which are in a range of 620-660° C.; and the second annealing is performed in AsH$_3$ protection atmosphere.

4. The method of manufacturing the Si-based high-mobility Group III-V/Ge channel CMOS according to claim 1, wherein the semi-insulating InGaP layer is lattice-matched with the Ge layer and has a growing rate of 0.1 nm/s-0.25 nm/s, with a V/III ratio (a ratio between an input mole flow rate of a Group V source and that of a Group III source) between 75 and 125.

5. The method of manufacturing the Si-based high-mobility Group III-V/Ge channel CMOS according to claim 4, wherein: dopant for growing the semi-insulating InGaP layer is ferrocene; a ratio between ferrocene flow and a sum flow of Group III source TMIn and TMGa used for the semi-insulating InGaP layer is about 1:1000; and the ferrocene flow is in an order of $1\times10^{-8}$ mol/min.

6. The method of manufacturing the Si-based high-mobility Group III-V/Ge channel CMOS according to claim 1, wherein: the GaAs cap layer has a thickness of 70-100 nm and is removed by less than 50 nm during the polishing; and the GaAs cap layer has a roughness of less than 0.5 nm after the polishing.

7. The method of manufacturing the Si-based high-mobility Group III-V/Ge channel CMOS according to claim 1, wherein the groove formed by the selective ICP etching has a parallel pattern, with a groove width being 500 nm and a space between neighboring grooves being 500-1000 nm.

8. The method of manufacturing the Si-based high-mobility Group III-V/Ge channel CMOS according to claim 1, wherein a top of the SiO$_2$ layer in the groove is flushed with a top of the nMOSFET structure.

9. The method of manufacturing the Si-based high-mobility Group III-V/Ge channel CMOS according to claim 8, wherein a width of the trench formed by ICP etching the SiO$_2$ layer is 200 nm, and the SiO$_2$ material on both sides of the trench have an identical thickness.

10. The method of manufacturing the Si-based high-mobility Group III-V/Ge channel CMOS according to claim 1, wherein a top surface of the Ge top layer is 100-150 nm higher than a top surface of the SiO$_2$ layer in the groove.

11. The method of manufacturing the Si-based high-mobility Group III-V/Ge channel CMOS according to claim 10, wherein the Ge top layer is corroded by HF diluted solution before being polished, so that the thickness of the SiO$_2$ layer on the top of the nMOSFET structure is reduced to 50 nm and the Ge top layer is polished to be flushed with the SiO$_2$ layer.

12. The method of manufacturing the Si-based high-mobility Group III-V/Ge channel CMOS according to claim 1, wherein: the nMOSFET structure comprises a GaAs buffer layer, an Al$_{0.3}$Ga$_{0.7}$As barrier layer, an In$_{0.25}$Ga$_{0.75}$As channel layer, an In$_{0.49}$Ga$_{0.51}$P etch stop layer and a GaAs doping contact layer, which are grown subsequently; and Si delta doping is performed in the Al$_{0.3}$Ga$_{0.7}$As barrier layer.

* * * * *